United States Patent [19]

Daugaard et al.

[11] Patent Number: 4,739,270
[45] Date of Patent: Apr. 19, 1988

[54] HIGH SPEED SPINNER FOR NMR SPECTROMETER

[75] Inventors: Preben Daugaard, Sabro; Vagn Langer, Brabrand; Hans J. Jakobsen, Viby J., all of Denmark

[73] Assignee: Varian Associates, Inc., Palo Alto, Calif.

[21] Appl. No.: 870,208

[22] Filed: Jun. 3, 1986

[51] Int. Cl.⁴ .................................. G01R 33/20
[52] U.S. Cl. ............................................. 324/321
[58] Field of Search ............... 324/300, 308, 318, 321; 73/863; 384/100

[56] References Cited

U.S. PATENT DOCUMENTS

| | | | |
|---|---|---|---|
| 2,960,649 | 11/1960 | Bloch | 324/321 |
| 4,254,373 | 3/1981 | Lippmaa et al. | 324/321 |
| 4,275,350 | 6/1981 | Hill et al. | 324/321 |
| 4,456,882 | 6/1984 | Doty | 324/318 |

OTHER PUBLICATIONS

Potter, W. H., "Apparatus to Rotate Samples Rapidly at Temperatures Less Than 2K in High Transverse Magnetic Fields", Rev. of Scientific Instruments, vol. 42, No. 5, May 1971.
Doty and Ellis, "Design of High Speed Sample Spinners", Rev. Sci. Inst., vol. 52, pp. 1868–1875, 1981.

Primary Examiner—Michael J. Tokar
Assistant Examiner—Kevin D. O'Shea
Attorney, Agent, or Firm—Stanley Z. Cole; Gerald M. Fisher; Edward H. Berkowitz

[57] ABSTRACT

An NMR spinner having a separate drive pressure and radial bearing pressure includes a differential pressure actuated valve for bleeding a portion of the radial bearing gas to the drive jets to provide for a slow rotation.

2 Claims, 2 Drawing Sheets

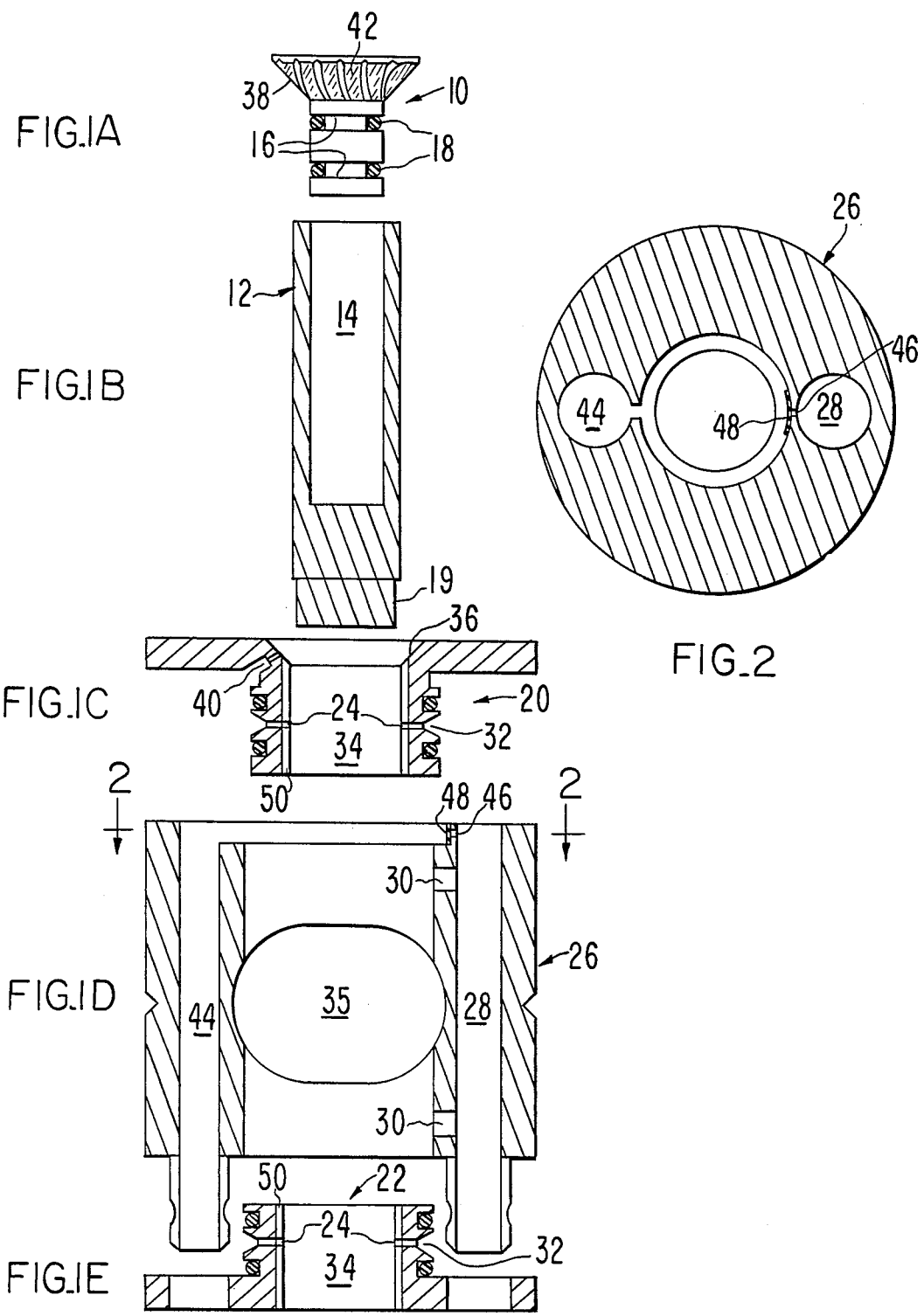

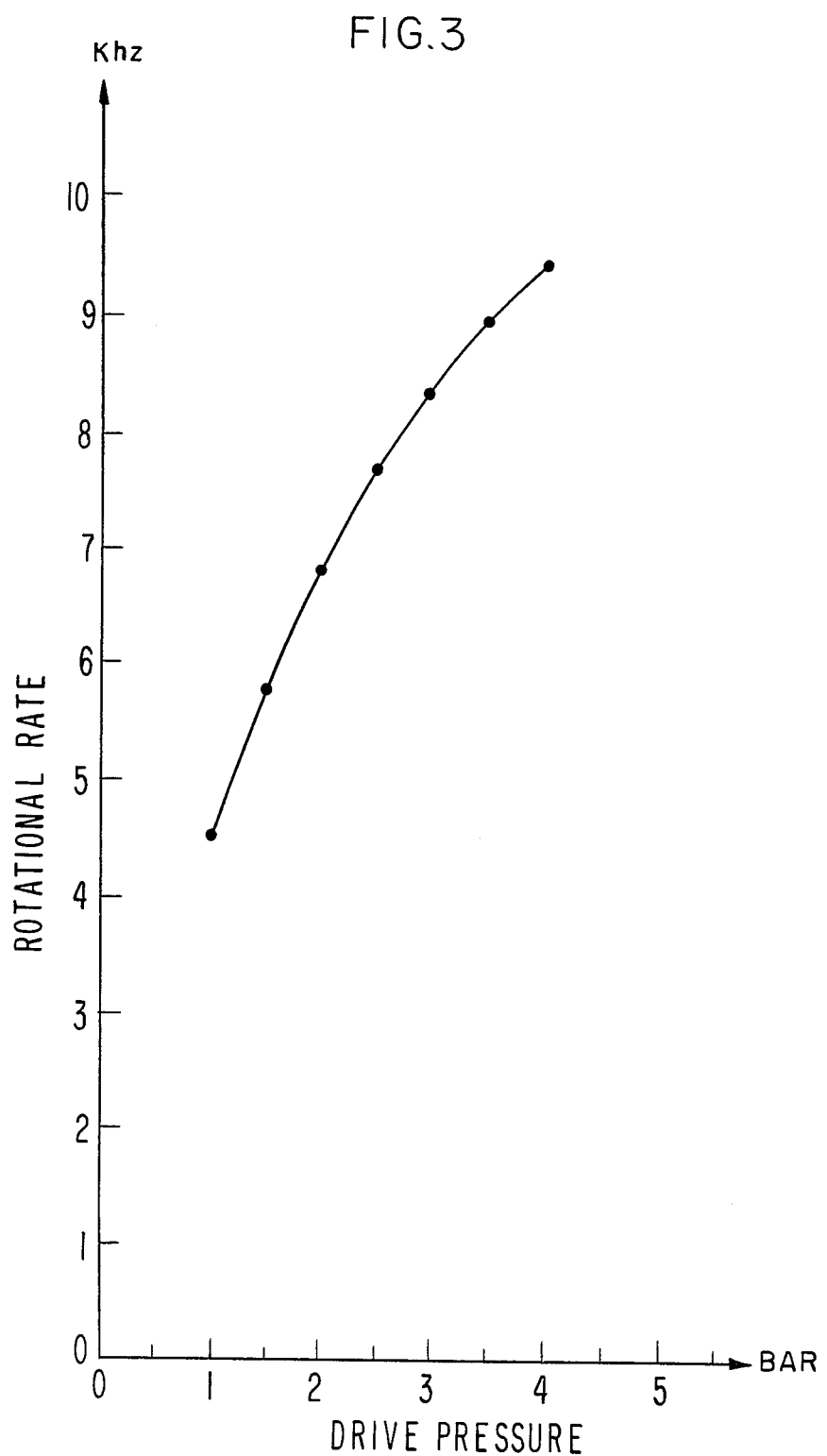

HIGH SPEED SPINNER FOR NMR SPECTROMETER

FIELD OF THE INVENTION

This invention relates generally to nuclear magnetic resonance (NMR) analytic instruments and, in particular, to means for rotating samples within such instruments.

The examination of the radio frequency (rf) magnetic resonance spectra of samples is facilitated by the high speed rotation of the sample, by which means residual gradients and inhomogeneities in the magnetic field are averaged azimuthally. Solid phase samples exhibit resonance lines which are inherently broadened by static dipolar interactions between nucleii. Furthermore, the chemical shift for nuclear moments within solids often depends on the inclination of the molecule or lattice with respect to the polarizing field. In a polycrystalline material where the orientations of magnetic moments of interest may be randomly oriented, this angular dependence yields a broadening of the resonance line. In liquids and gases, thermal motions tend to average these effects so that sharp resonance lines are observed. For solids, an effective averaging may also be realized by the practice of "magic angle spinning". For this technique, the spinning axis is inclined at an angle $\theta$ with respect to the polarizing magnetic field satisfying the conditions $1-3\cos^2\theta=0$. The magic angle is the solution of that condition, for which $\theta=54°\ 44'$. Further, the spin rate should be high in proportion with the strength of the inter-nuclear interaction or spread of chemical shift values, which is achieved with spinning rates of the order of several KHz. Finally, the spin rate must be relatively stable over the duration of the experiment.

Several items of prior art are known for spinning apparatus. One example is given in U.S. Pat. No. 4,275,350, which apparatus employs separate air bearings for the three functions of radial stabilization, rotation and levitation of the rotor for the stator.

Another item of prior art is the work of Doty et al, "Design of High Speed Cylindrical NMR Sample Spinners", Rev. Sci. Inst., vol. 52, December 1981, pp. 1868-1875.

BRIEF DESCRIPTION OF THE INVENTION

The present invention utilizes an automatic valve arrangement which in normal operation isolates the drive gas pressure source from the radial stabilizing gas source. When the normal higher pressure drive gas pressure falls below the radial bearing gas pressure, the valve opens to bleed a portion of the radial bearing gas to the drive jets to maintain the bearing until the spinner can be controllably stopped.

BRIEF DESCRIPTION OF THE FIGURES

FIGS. 1a-1c shows a rotor assembly for the spinner of the present invention. FIGS. 1c-e shows a stator assembly for the present invention.

FIG. 2 is a section through the component of FIG. 1d.

FIG. 3 shows the dependence of spin rate on drive gas pressure.

DETAILED DESCRIPTION OF THE INVENTION

The spinner unit is shown as disassembled constituents in FIGS. 1a-e. The rotor assembly comprises the end cap 10 and the rotor body 12. The latter has a cavity 14 therein to contain the sample and is closed by insertion of end cap 10. Preferably, there are grooves 16 machined into the end cap for retaining resilient seals 18 to provide reliable closure of cavity 14. Rotor body 12 is preferably constructed from Macor, $Al_2O_3$, partially stabilized zirconia or Torlon. End cap 10 is preferably constructed from PMMA, Kel-F or Torlon. The length of the rotor body 12 may include a portion 19 which may be arranged to cooperate in a known manner with a light source and light sensor, not shown, to monitor spinning rate during operation.

The stator assembly comprises three pieces as shown in FIGS. 1c-e. The top piece 20 and bottom piece 22 each contain twelve radially directed jets 24. These jets each comprise 0.3 mm apertures. Stator body 26 contains a bore 38 with ports 30 to communicate with annular regions 32 to provide pressurized gas to radial jets 24 for stabilizing the axis of rotor body 12 in operation. It should be apparent that when assembled, top and bottom pieces 20 and 22 define bore 34 through which rotor body 12 is inserted for operation. An access port 35 is cut into stator body 26 to permit insertion of the coil or coils employed for excitation and detection of nuclear magnetic resonance in the sample contained within rotor body 12.

Top piece 20 has inner conical surface 36 which accepts the outer conical profile 38 of end cap 10. Twelve jets 40 are distributed annularly on the inner conical surface 36 to provide pressurized gas which acts on flutes 42 of the rotor assembly for levitating and rotating the rotor assembly. The pressurized gas for jets 40 is furnished from bore 44. These jets comprise apertures of 0.4 mm diameter.

In typical operation, the gases in the respective bores 28 and 44 are maintained at different pressures. In a usual arrangement for such dual jet spinner apparatus, the rotation, or drive pressure may be several bars greater than the radial bearing pressure. When the drive pressure in such apparatus is reduced to 0, the result is often a severe impact of the rotor assembly against the stator. In the present invention this is prevented by disposing a simple check valve between the two pressurized bores supplying the respective jets. When the pressure of the normally high pressure jets falls below the pressure at the low pressure jets, the check valve opens to bleed a portion of the low pressure gas into the formerly high pressure region. In a practical situation this permits maintenance of the levitation of the rotor and slow rotation to occur thereby avoiding damage by sudden impact. It should be noted that such damage frequently entails the removal, disassembly and replacement of portions of the stator assembly.

In the present invention a check valve is established between the volume of bore 28 and the drive jets 40 by means of aperture 46 and flapper 48. Flapper 48 is constructed from a thin piece of plastic conforming to the surface in which aperture 46 is formed. Aperture 48 is 1 mm in length and 0.5 mm in diameter. Flapper 48 is glued or otherwise affixed on one side so that it opens whenever the pressure from bore 44 falls below the pressure then obtaining in bore 28 (usually about 1 bar).

One example of the present invention is capable of stable operation (±1 Hz) from 250 Hz to 9500 Hz and contains 225 microliter of sample measuring 25 mm×7 mm o.d. Spinning rate as a function of drive pressure is shown in FIG. 3.

The stator further utilizes a special lining 50, machined from a stable nonconducting material such as Macor, $Al_2O_3$ or PSZ. This lining 50 is press fitted into the top and bottom pieces and the stator is then assembled. The linings 50 are then bored out to $7+0.02/-0.00$ mm. It is occasionally necessary to disassemble the stator in order to service the components, replace an RF coil, or the like. This construction assures reproducible operation and close tolerances which contribute to the excellent stability of operation of the spinner.

What is claimed is:

1. Apparatus for spinning a sample about an axis comprising rotor means for containing a sample and for rotation in response to pressurized gas directed along the outer surface thereof, and stator means surrounding said rotor means and comprising gas jets to cause rotation of said rotor means, first gas supply means for supplying gas at a first pressure to cause rotation and levitation of said rotor means, second supply means for supplying gas at a second pressure to maintain radial stability of said rotor means, valve mean for bleeding a portion of said gas from said second supply means to said first supply means for maintaining said first pressure at a value sufficient to prevent said rotor means from impacting against said stator means in the absence of gas at said first pressure from said first gas supply means.

2. The method of preventing damage to an NMR sample spinner while terminating the spinning thereof, said sample spinner having separate first and second gas pressure sources supplying gas bearings for respectively stabilizing said sample spinner and for rotating said sample spinner, said second gas pressure greater than said first gas pressure and said second gas pressure adjustable to a selected value, said second gas pressure greater than the first gas pressure in operation, comprising (a) reducing the pressure of said second gas pressure source to a value less than the pressure of said first gas pressure source, (b) responding to the reduction of the pressure of said second gas pressure by automatically opening a valve between said separate first and second gas pressure sources, and (c) maintaining the gas pressure at said second pressure source by an amount dependent upon said first gas pressure source.

* * * * *

UNITED STATES PATENT AND TRADEMARK OFFICE
CERTIFICATE OF CORRECTION

PATENT NO. : 4,739,270
DATED : April 19, 1988
INVENTOR(S) : Preben Daugaard, Vagn Langer and Hans J. Jakobsen It is certified that error appears in the above-identified patent and that said Letters Patent are hereby corrected as shown below:

Col. 2, line 22, delete "38" and substitute --28--.

Signed and Sealed this

Sixth Day of December, 1988

Attest:

DONALD J. QUIGG

*Attesting Officer*  *Commissioner of Patents and Trademarks*